(12) United States Patent
Kuroiwa (10) Patent No.: US 10,250,259 B2
(45) Date of Patent: Apr. 2, 2019

(54) DEVICE AND METHOD FOR DIGITAL SIGNAL TRANSMISSION

(71) Applicant: Synaptics Japan GK, Tokyo (JP)

(72) Inventor: Tsuyoshi Kuroiwa, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/926,703

(22) Filed: Mar. 20, 2018

(65) Prior Publication Data

US 2018/0278251 A1 Sep. 27, 2018

(30) Foreign Application Priority Data

Mar. 24, 2017 (JP) .................................. 2017-058347

(51) Int. Cl.
| | |
|---|---|
| *H03K 19/00* | (2006.01) |
| *H03K 19/20* | (2006.01) |
| *H03K 19/003* | (2006.01) |
| *H04B 1/04* | (2006.01) |
| *H03K 3/037* | (2006.01) |
| *H04B 1/16* | (2006.01) |
| *H03K 19/21* | (2006.01) |
| *H03K 5/05* | (2006.01) |
| *H03K 5/13* | (2014.01) |
| *H03K 3/12* | (2006.01) |

(52) U.S. Cl.
CPC ....... *H03K 19/00346* (2013.01); *H03K 3/037* (2013.01); *H03K 3/12* (2013.01); *H03K 5/05* (2013.01); *H03K 5/13* (2013.01); *H03K 19/20* (2013.01); *H03K 19/21* (2013.01); *H04B 1/04* (2013.01); *H04B 1/16* (2013.01)

(58) Field of Classification Search
CPC .......... H03K 3/037; H03K 19/018507; H03K 19/21; H03K 19/00; H03K 19/0175; H03K 19/20; H03K 2005/00234; H03K 5/151; H03K 19/0033; H03K 19/00392; H03K 19/00346; H03K 3/03
See application file for complete search history.

(56) References Cited

U.S. PATENT DOCUMENTS

| | | | |
|---|---|---|---|
| 4,432,016 A * | 2/1984 | Shanley, II | ............ H03K 17/60 348/589 |
| 6,278,740 B1 * | 8/2001 | Nordyke | .................. H04B 3/00 327/63 |
| 7,005,886 B2 * | 2/2006 | Linam | .................. H03K 17/164 326/30 |

(Continued)

FOREIGN PATENT DOCUMENTS

JP 07093994 A * 4/1995

*Primary Examiner* — Vibol Tan (74) *Attorney, Agent, or Firm* — Patterson + Sheridan, LLP (57) ABSTRACT

A system and method for digital signal reception comprise outputting first and second digital transmission signals complementary to each other. Further, a first and second output signals are outputted. The first output signal has a logical value based on a product of a logical value of the first digital transmission signal and a logical value complementary to a logical value of the second digital transmission signal is outputted. The second output signal has a logical value based on a sum of a logical value complementary to the logical value of the first digital transmission signal and the logical value of the second digital transmission signal.

16 Claims, 5 Drawing Sheets

(56) References Cited

U.S. PATENT DOCUMENTS

| | | | | |
|---|---|---|---|---|
| 7,586,334 B2 * | 9/2009 | Manfred | ................ | H03K 19/00 |
| | | | | 326/105 |
| 8,155,215 B2 * | 4/2012 | Ichiyama | .............. | H04L 25/493 |
| | | | | 327/100 |
| 8,872,545 B2 * | 10/2014 | Lee | ........................ | H03K 19/21 |
| | | | | 326/113 |
| 2003/0070126 A1 * | 4/2003 | Werner | ............ | G01R 31/31715 |
| | | | | 714/715 |

* cited by examiner

DEVICE AND METHOD FOR DIGITAL SIGNAL TRANSMISSION

CROSS REFERENCE

This application claims priority of Japanese Patent Application No. 2017-058347, filed on Mar. 24, 2017, the disclosure of which is incorporated herein by reference.

TECHNICAL FIELD

The present invention is related to a digital signal transmission apparatus, a clock signal transmission apparatus and receiver circuitry used therein.

BACKGROUND ART

Systems incorporating one or more integrated circuit (IC) chips are typically designed to achieve reliable digital signal transmission within an IC chip or between IC chips to improve system reliability.

Noise is one of factors which obstruct reliable digital signal transmission. When noise is applied to a power line, for example, the noise is delivered to signal lines within the IC chip and/or signal lines connected between the IC chips. This adversely affects digital signal transmission and may negatively affect the reliability of the entire system as the noise influences signal lines transmitting digital signals, such as a reset signal and an interrupt signal.

Approaches for suppressing influences of noise may include optimization of circuit board design and layout design, and provision of large bypass capacitors. These approaches may be, however, insufficient for suppressing influences of noise.

Thus, there is a need to improve the reliability of digital signal transmission.

SUMMARY

In one embodiment, a digital signal transmission apparatus comprises transmitter circuitry and receiver circuitry. The transmitter circuitry configured is to output first and second digital transmission signals complementary to each other. The receiver circuitry comprises AND circuitry and OR circuitry. The AND circuitry is configured to output a first output signal having a logical value based on a product of a logical value of the first digital transmission signal and a logical value complementary to a logical value of the second digital transmission signal. The OR circuitry is configured to output a second output signal having a logical value based on a sum of a logical value complementary to the logical value of the first digital transmission signal and the logical value of the second digital transmission signal.

In one embodiment, a receiver circuitry comprises AND circuitry and OR circuitry. The AND circuitry is configured to receive first and second digital transmission signals complementary to each other, and output a first output signal having a logical value of a logical product of a logical value of the first digital transmission signal and a logical value complementary to a logical value of the second digital transmission signal. The OR circuitry is configured to receive the first and second digital transmission signals, and output a second output signal having a logical value of a logical sum of a logical value complementary to the logical value of the first digital transmission signal and the logical value of the second digital transmission signal.

In one embodiment, a method for digital signal reception comprises receiving first and second digital transmission signals complementary to each other, and outputting a first output signal having a logical value of a logical product of a logical value of the first digital transmission signal and a logical value complementary to a logical value of the second digital transmission signal. The method further comprises outputting a second output signal having a logical value of a logical sum of a logical value complementary to the logical value of the first digital transmission signal and the logical value of the second digital transmission signal, selecting one of the first and second output signals in response to a logical value on an output node, and outputting a digital reception signal to the output node in response to the selected one of the first and second output signals.

DETAILED DESCRIPTION

In the following, a description is given of various embodiments with reference to the attached drawings.

Figure 1:
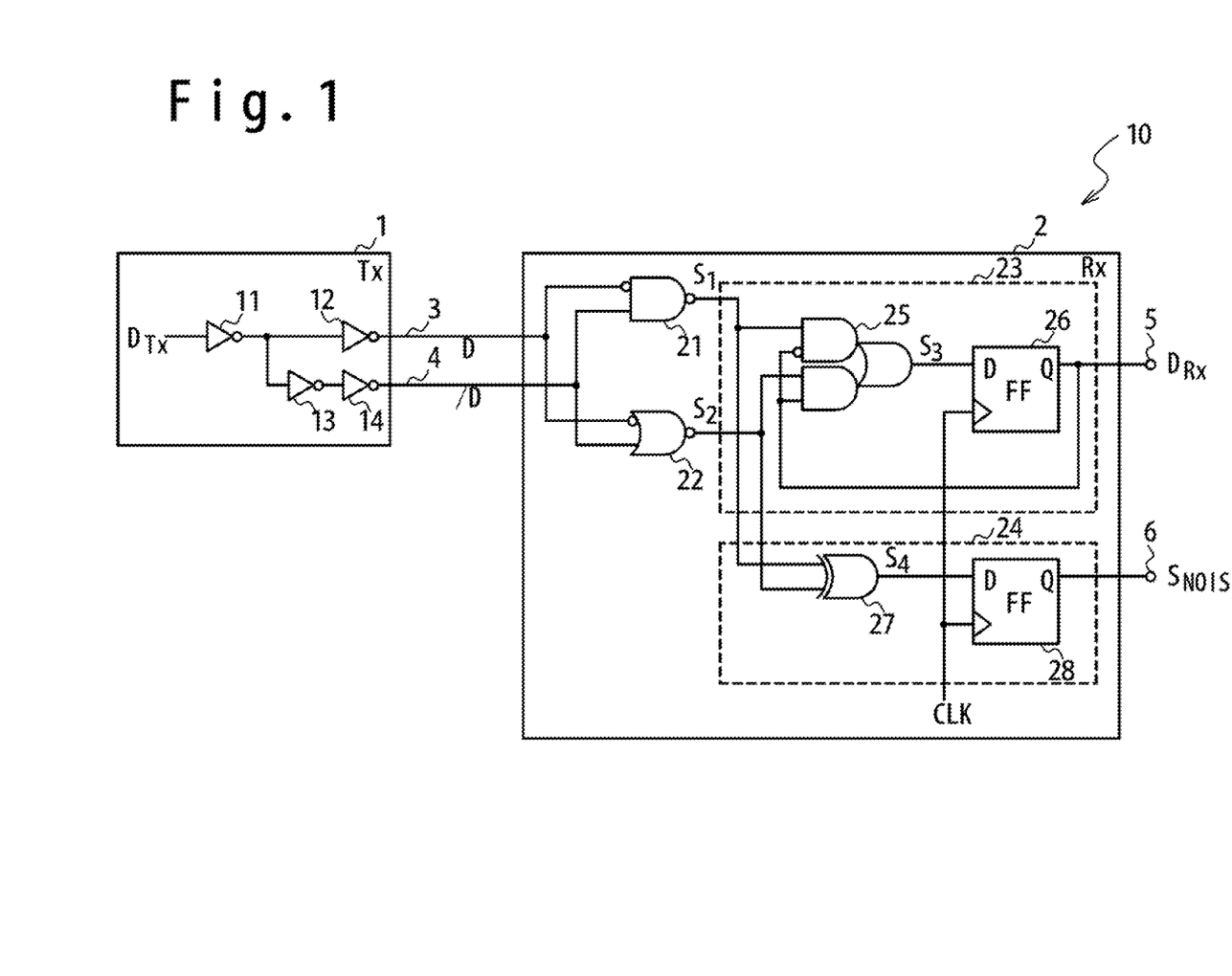
FIG. 1 is a circuit diagram illustrating the configuration of a digital signal transmission apparatus according to one or more embodiments.

FIG. 1 is a circuit diagram illustrating the configuration of a digital signal transmission apparatus 10 according to one or more embodiments. The digital signal transmission apparatus 10 of this embodiment includes transmitter circuitry 1 and receiver circuitry 2. The transmitter circuitry 1 and the receiver circuitry 2 are connected by a pair of signal lines 3 and 4. In one embodiment, the transmitter circuitry 1, the receiver circuitry 2 and the signal lines 3 and 4 may be monolithically integrated within the same IC chip. In an alternative embodiment, the transmitter circuitry 1 and the receiver circuitry 2 may be integrated within two different IC chips and the signal lines 3 and 4 may be connected between the two IC chips.

In one embodiment, the transmitter circuitry 1 generates first and second digital transmission signal D and /D complementary to each other from a digital transmission signal $D_{Tx}$. The transmitter circuitry 1 includes inverters 11 to 14, and the first and second digital transmission signal D and /D are generated with the inverters 11 to 14. In this embodiment, the first digital transmission signal D is generated to have the same logical value as the original digital transmission signal $D_{Tx}$, and the second digital transmission signal /D is generated to have the logical value complementary to that of the first digital transmission signal D. The transmitter circuitry 1 outputs the first digital transmission signal D to the signal line 3 and the second digital transmission signal /D to the signal line 4.

In one embodiment, the receiver circuitry 2 is configured to receive the first digital transmission signal D from the signal line 3 and the second digital transmission signal /D from the signal line 4, and output a digital reception signal $D_{Rx}$ corresponding to the first and second digital transmission signals D and /D, which correspond to the original digital transmission signal $D_{Tx}$, to an output node 5.

In this embodiment, the receiver circuitry 2 includes AND circuitry 21, OR circuitry 22, an output selector circuitry 23 and a noise detection circuitry 24.

The AND circuitry 21 has a first input connected to the signal line 3 and a second input connected to the signal line 4. The first input of the AND circuitry 21 receives the first digital transmission signal D from the signal line 3 and the second input receives the second digital transmission signal /D from the signal line 4. The AND circuitry 21 is configured to output an output signal $S_1$ having the logical value of the logical product of the logical value of the first digital transmission signal D and the logical value complementary to the logical value of the second digital transmission signal /D.

According to one or more embodiments, FIG. 1 illustrates the configuration in which a NAND gate having an inverting input and a non-inverting input is used as the AND circuitry 21 to achieve the above-described logical operation. The first digital transmission signal D is supplied to the inverting input of the NAND gate, and the second digital transmission signal /D is supplied to the non-inverting input of the NAND gate. Such a configuration allows the number of gates along the route over which the first digital transmission signal D is transmitted to be equal to that along the route over which the second digital transmission signal /D is transmitted.

The OR circuitry 22 has a first input connected to the signal line 3 and a second input connected to the signal line 4. The first input of the OR circuitry 22 receives the first digital transmission signal D from the signal line 3 and the second input receives the second digital transmission signal /D from the signal line 4. The OR circuitry 22 is configured to output an output signal $S_2$ having the logical value of the logical sum of the logical value of the first digital transmission signal D and the logical value complementary to the logical value of the second digital transmission signal /D.

According to one or more embodiments, FIG. 1 illustrates the configuration in which an NOR gate having an inverting input and a non-inverting input is used as the OR circuitry 22 to achieve the above-described logical operation. The first digital transmission signal D is inputted to the inverting input of the NOR gate, and the second digital transmission signal /D is inputted to the non-inverting input of the NOR gate. This configuration allows the number of the gates of the route over which the first digital transmission signal D is transmitted to be equal to that of the gates of the route over which the second digital transmission signal /D is transmitted.

In one embodiment, the output selector circuitry 23 is configured to select one of the output signals $S_1$ and $S_2$ in response to the logical value on an output node 5, and output a digital reception signal $D_{Rx}$ in response to the selected output signal.

More specifically, the output selector circuitry 23 may include a selector 25 and a flipflop 26. The selector 25 selects one of the output signals $S_1$ and $S_2$ in response to the logical value on the output node 5, and outputs the selected output signal as an output signal $S_3$. In this embodiment, the selector 25 selects the output signal $S_1$ of the AND circuitry 21 when the logical value on the output node 5 is "low", and selects the output signal $S_2$ of the OR circuitry 22 when the logical value on the output node 5 is "high". The flipflop 26 has a data input connected to the output of the selector 25, a data output connected to the output node 5 and a clock input to which a clock signal CLK is supplied. The flipflop 26 latches the logical value of the output signal $S_3$ received from the selector 25 in synchronization with the clock signal CLK and outputs an output signal having the latched logical value from the data output. The output signal outputted from the data output of the flipflop 26 is supplied to the output node 5 as the digital reception signal $D_{Rx}$.

The noise detection circuitry 24 may be configured to generate a noise detection signal $S_{NOISE}$ from the output signals $S_1$ and $S_2$, which are received from the AND circuitry 21 and the OR circuitry 22, respectively, and output the noise detection signal $S_{NOISE}$ to a noise detection output 6. The noise detection signal $S_{NOISE}$ is used to detect application of severe noise, for example, noise which causes misidentification of the logical values of the first and second digital transmission signals D and /D, onto the signal lines 3 and 4.

In this embodiment, the noise detection circuitry 24 includes an XOR circuitry 27 and a flipflop 28. The XOR circuitry 27 is configured to output an output signal $S_4$ having the logical value of the exclusive logical sum of the logical value of the output signal $S_1$ of the AND circuitry 21 and the logical value of the output signal $S_2$ of the OR circuitry 22. The flipflop 28 has a data input connected to the output of the XOR circuitry 27, a data output connected to the noise detection output 6 and a clock input to which the clock signal CLK is supplied.

A description is then given of the operation of the digital signal transmission apparatus 10 according to one or more embodiments. The digital signal transmission apparatus 10 of this embodiment is configured to have high tolerance against common mode noise. Noise may have a polarity. One type of common mode noise increases the potential of a signal line and another type decreases the potential of a signal line. In the following, the polarity of noise which increases the potentials of the signal lines 3 and 4 is referred to as "positive polarity" and the polarity of noise which decreases the potentials of the signal lines 3 and 4 is referred to as "negative polarity". The digital signal transmission apparatus 10 of this embodiment is configured to suppress influences of common mode noise with respect to both of the positive and negative polarities.

The digital signal transmission apparatus 10 of this embodiment, which is configured to select the output signal $S_1$ of the AND circuitry 21 and the output signal $S_2$ of the OR circuitry 22 in response to the logical value on the output node 5, that is, the logical value of the digital reception signal $D_{Rx}$, can correctly receive the first digital transmission signal D and the second digital transmission signal /D.

Common mode noise of the positive polarity may influence one of the first and second digital transmission signals D and /D which has the logical value "low" and common mode noise of the negative polarity may influence one of the first and second digital transmission signals D and /D which has the logical value "high". The digital signal transmission apparatus 10 of this embodiment is configured so that the logical value of the digital reception signal $D_{Rx}$ is determined based on one of the digital transmission signals which has the logical value "high", when common mode noise of the positive polarity is applied, and determined based on one of the digital transmission signals which has the logical value "low", when common mode noise of the negative polarity is applied. Through this operation, the digital signal transmission apparatus 10 effectively suppresses influences of common mode noise, regardless of the polarity of the common mode noise.

In detail, the output signal $S_1$ of the AND circuitry 21 is free from influences of common mode noise of both of the positive and negative polarities, when the logical value of the first digital transmission signal D is "low" and the logical value of the second digital transmission signal /D is "high". This is because the logical value of the output signal $S_1$ of the AND circuitry 21 is determined by the logical value of the second digital transmission signal /D, when common mode noise of the positive polarity is applied, and the logical value of the output signal $S_1$ of the AND circuitry 21 is determined by the logical value of the first digital transmission signal D, when common mode noise of the negative polarity is applied.

The output signal $S_2$ of the OR circuitry 22 is, on the other hand, free from influences of common mode noise of both of the positive and negative polarities, when the logical value of the first digital transmission signal D is "high" and the logical value of the second digital transmission signal /D is "low". This is because the logical value of the output signal $S_2$ of the OR circuitry 22 is determined by the logical value of the first digital transmission signal D, when common mode noise of the positive polarity is applied, and the logical value of the output signal $S_2$ of the OR circuitry 22 is determined by the logical value of the second digital transmission signal /D, when common mode noise of the negative polarity is applied.

The digital signal transmission apparatus 10 of this embodiment is configured to select the output signal $S_1$ of the AND circuitry 21 when the logical value on the output node 5, that is, the just previous logical value of the first digital transmission signal D is "low", and select the output signal $S_2$ of the OR circuitry 22 when the logical value on the output node 5 is "high". This operation allows correctly receiving the first and second digital transmission signals D and /D, even when common mode noise of any of the positive and negative polarities is applied to the signal lines 3 and 4.

Figure 2:
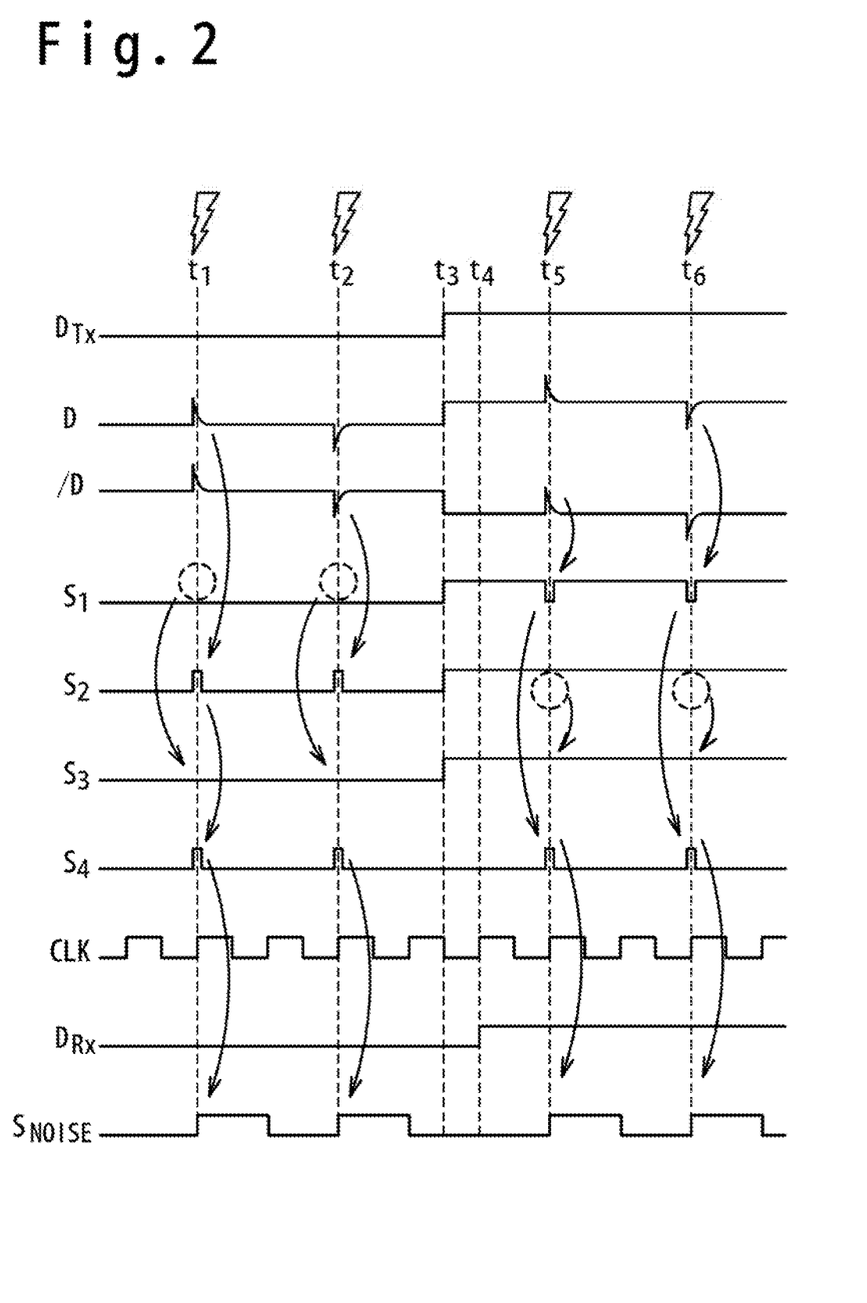
FIG. 2 is a timing chart illustrating an exemplary operation of the digital signal transmission apparatus according to one or more embodiments.

FIG. 2 is a timing chart illustrating an exemplary operation of the digital signal transmission apparatus 10 according to one or more embodiments. In an initial state, both of the logical values of the digital transmission signal $D_{TX}$ in the transmitter circuitry 1 and the digital transmission signal $D_{Rx}$ in the receiver circuitry 2 are "low". In this case, the logical values of the first digital transmission signal D and the second digital transmission signal /D on the signal lines 3 and 4 are "low" and "high", respectively. The logical values of the output signals $S_1$ to $S_4$, which are generated in the receiver circuitry 2, are all "low".

The flipflop 26 of the receiver circuitry 2 latches the output signal $S_3$ of the selector 25 in synchronization with the clock signal CLK, in the operation illustrated in FIG. 2, in synchronization with the rising edges of the clock signal CLK. The logical value of the output signal $S_3$ of the selector 25 is "low" as long as the logical value of the digital transmission signal $D_{Tx}$ is "low". Accordingly, the logical value of the digital reception signal $D_{Rx}$ output from the flipflop 26 is also kept at "low".

When common mode noise of the positive polarity, which increases the potentials on both of the signal lines 3 and 4, is applied at time $t_1$, the output signal $S_2$ of the OR circuitry 22 temporarily becomes "high" due to an influence of the common mode noise; however, the output signal $S_1$ of the AND circuitry 21 is kept at "low", being free from the influence of the common mode noise. Meanwhile, the selector 25 selects the output signal $S_1$ of the AND circuitry 21 in response to the logical value on the output node 5, that is, the logical value of the digital reception signal $D_{Rx}$. As a result, the logical value of the output node 5 is kept at "low", being free from the influence of the common mode noise.

Meanwhile, the output signal $S_4$ of the XOR circuitry 27 is temporarily set to "high", since the logical value of the output signal $S_2$ of the OR circuitry 22 is temporarily set to "high" while the output signal $S_1$ of the AND circuitry 21 is kept at "low". When a rising edge of the clock signal CLK is at the timing where the output signal $S_2$ of the OR circuitry 22 is influenced by the common mode noise, the logical value of the noise detection signal $S_{NOISE}$ is set to "high", since the flipflop 28 latches the output signal $S_4$ of the XOR circuitry 27 at the timing where the output signal $S_4$ of the XOR circuitry 27 temporarily becomes "high". By monitoring the noise detection signal $S_{NOISE}$ thus generated, it is possible to detect that common mode noise is applied to the signal lines 3 and 4 at time $t_1$.

Common mode noise of the negative polarity is then applied at time $t_2$. Also in this case, the output signal $S_2$ of the OR circuitry 22 temporarily becomes "high" due to an influence of the common mode noise; however, the output signal $S_1$ of the AND circuitry 21 is kept at "low", being free from the influence of the common mode noise. Meanwhile, the selector 25 selects the output signal $S_1$ of the AND circuitry 21 in response to the logical value on the output node 5, that is, the logical value of the digital reception signal $D_{Rx}$. As a result, the logical value on the output node 5 is kept at "low", being free from the influence of the common mode noise.

Meanwhile, the output signal $S_4$ of the XOR circuitry 27 temporarily becomes "high", since the logical value of the output signal $S_2$ of the OR circuitry 22 temporarily becomes "high" with the output signal $S_1$ of the AND circuitry 21 kept at "low". As a result, the logical value of the noise detection signal $S_{NOISE}$ is set to "high". By monitoring the noise detection signal $S_{NOISE}$ thus generated, it is possible to detect that common mode noise is applied to the signal lines 3 and 4 at time $t_2$.

The digital transmission signal $D_{Tx}$ is then switched from "low" to "high" at time $t_3$. At this moment, the first and second digital transmission signals D and /D, which are transmitted over the signal lines 3 and 4, respectively, are switched to "high" and "low", respectively. The output signals $S_1$ to $S_3$ are switched from "low" to "high" in the receiver circuitry 2, in response to the first and second digital transmission signals D and /D.

When the clock signal CLK is then pulled up at time $t_4$, the flipflop 26 latches the logical value of the output signal $S_3$, and the digital reception signal $D_{Rx}$ is switched from "low" to "high".

Common mode noise of the positive polarity is then applied in this state at time $t_5$. In this case, the output signal $S_1$ of the AND circuitry 21 temporarily becomes "low" due to an influence of the common mode noise; however the output signal $S_2$ of the OR circuitry 22 is kept at "high", being free from the influence of the common mode noise. Meanwhile, the selector 25 selects the output signal $S_2$ of the OR circuitry 22 in response to the logical value on the output node 5, that is, the logical value of the digital reception signal $D_{Rx}$. As a result, the logical value on the output node 5 is kept at "high", being free from the influence of the common mode noise.

Meanwhile, the output signal $S_4$ of the XOR circuitry 27 temporarily becomes "high", since the logical value of the output signal $S_1$ of the AND circuitry 21 temporarily becomes "low" with the output signal $S_2$ of the OR circuitry 22 kept at "high". When a rising edge of the clock signal CLK is at the timing where the output signal $S_1$ of the AND circuitry 21 is influenced by the common mode noise, the logical value of the noise detection signal $S_{NOISE}$ is set to "high", since the flipflop 28 latches the output signal $S_4$ of the XOR circuitry 27 at the timing where the output signal $S_4$ of the XOR circuitry 27 temporarily becomes "high". By monitoring the noise detection signal $S_{NOISE}$ thus generated, it is possible to detect that common mode noise is applied to the signal lines 3 and 4 at time $t_5$.

Common mode noise of the negative polarity is then applied at time $t_5$. Also in this case, the output signal $S_1$ of the AND circuitry 21 temporarily becomes "low" due to an influence of the common mode noise; however the output signal $S_2$ of the OR circuitry 22 is kept at "high", being free from the influence of the common mode noise. Meanwhile, the selector 25 selects the output signal $S_2$ of the OR circuitry 22 in response to the logical value on the output node 5, that is, the logical value of the digital reception signal $D_{Rx}$. As a result, the logical value on the output node 5 is kept at "high", being free from the influence of the common mode noise.

Meanwhile, the output signal $S_4$ of the XOR circuitry 27 temporarily becomes "high", since the logical value of the output signal $S_1$ of the AND circuitry 21 temporarily becomes "low" with the output signal $S_2$ of the OR circuitry 22 kept at "high". As a result, the logical value of the noise detection signal $S_{NOISE}$ is set to "high". By monitoring the noise detection signal $S_{NOISE}$ thus generated, it is possible to detect that common mode noise is applied to the signal lines 3 and 4 at time $t_6$.

As thus described, the digital signal transmission apparatus 10 according to one or more embodiments can suppress influences of common mode noise in transmitting a digital signal for both of the positive and negative polarities. Additionally, the digital signal transmission apparatus 10 of this embodiment can detect application of common mode noise onto the signal lines 3 and 4.

Figure 3:
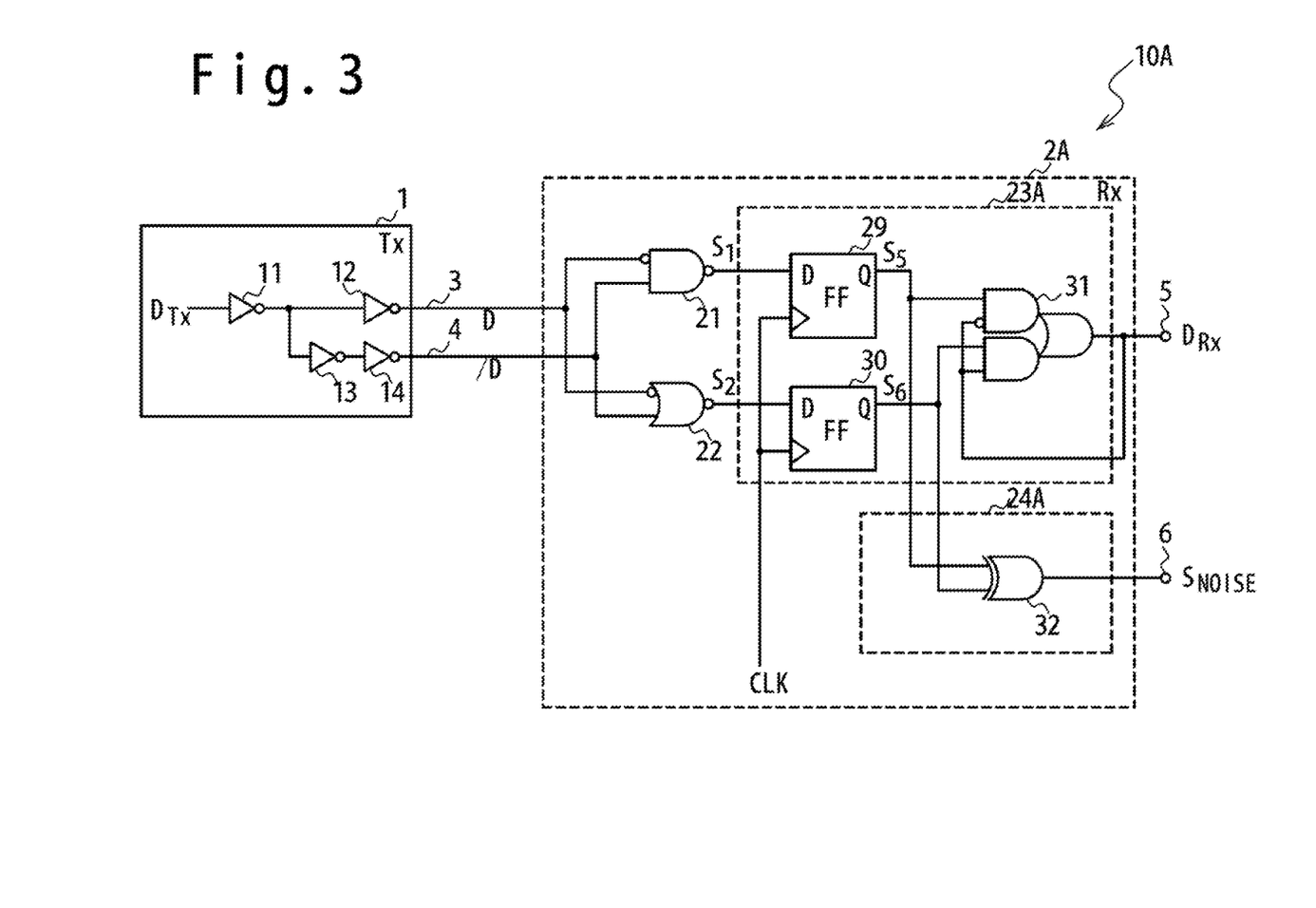
FIG. 3 is a circuit diagram illustrating a configuration of a digital signal transmission apparatus according to one or more embodiments.

FIG. 3 is a circuit diagram illustrating the configuration of a digital signal transmission apparatus 10A in according to one or more embodiments. The digital signal transmission apparatus 10A according to one or more embodiments is configured similarly to the digital signal transmission apparatus 10 of the according to one or more embodiments. In one or more embodiments, the configuration of the receiver circuitry 2A, more specifically, the configurations of the output selector circuitry 23A and the noise detection circuitry 24A are modified. In the receiver circuitry 2A of according to one or more embodiments, the output signals $S_1$ and $S_2$ of the AND circuitry 21 and the OR circuitry 22 are latched by flipflops in place of the output signal of the selector 25.

More specifically, the output selector circuitry 23A includes flipflops 29, 30 and a selector 31 according to one or more embodiments. The flipflop 29 latches the logical value of the output signal $S_1$ of the AND circuitry 21 in synchronization with the clock signal CLK, and outputs an output signal $S_5$ having the latched logical value from the data output thereof. The flipflop 30 latches the logical value of the output signal $S_2$ of the OR circuitry 22 in synchronization with the clock signal CLK, and outputs an output signal $S_6$ having the latched logical value from the data output thereof. The selector 31 selects one of the output signals $S_5$ and $S_6$ of the flipflops 29 and 30 in response to the logical value on the output node 5, that is, the logical value of the digital reception signal $D_{Rx}$.

Since the output signals $S_5$ and $S_6$ of the flipflops 29 and 30 are generated by latching the logical values of the output signals $S_1$ and $S_2$ of the AND circuitry 21 and the OR circuitry 22, respectively, the output signals $S_1$ and $S_2$ of the AND circuitry 21 and the OR circuitry 22 are selected in response to the logical value on the output node 5 also in this embodiment. In this embodiment, the selector 31 selects the output signal $S_5$ of the flipflop 29 when the logical value on the output node 5 is "low", and selects the output signal $S_6$ of the flipflop 30 when "high". The output signal selected by the selector 31 is output to the output node 5 as the digital reception signal $D_{Rx}$.

The noise detection circuitry 24A includes an XOR circuitry 32. The XOR circuitry 32 is configured to output an output signal having the logical value of the exclusive logical sum of the logical values of the output signals $S_5$ and $S_6$ of the flipflops 29 and 30. The output signal of the XOR circuitry 32 is used as the noise detection signal $S_{NOISE}$.

Figure 4:
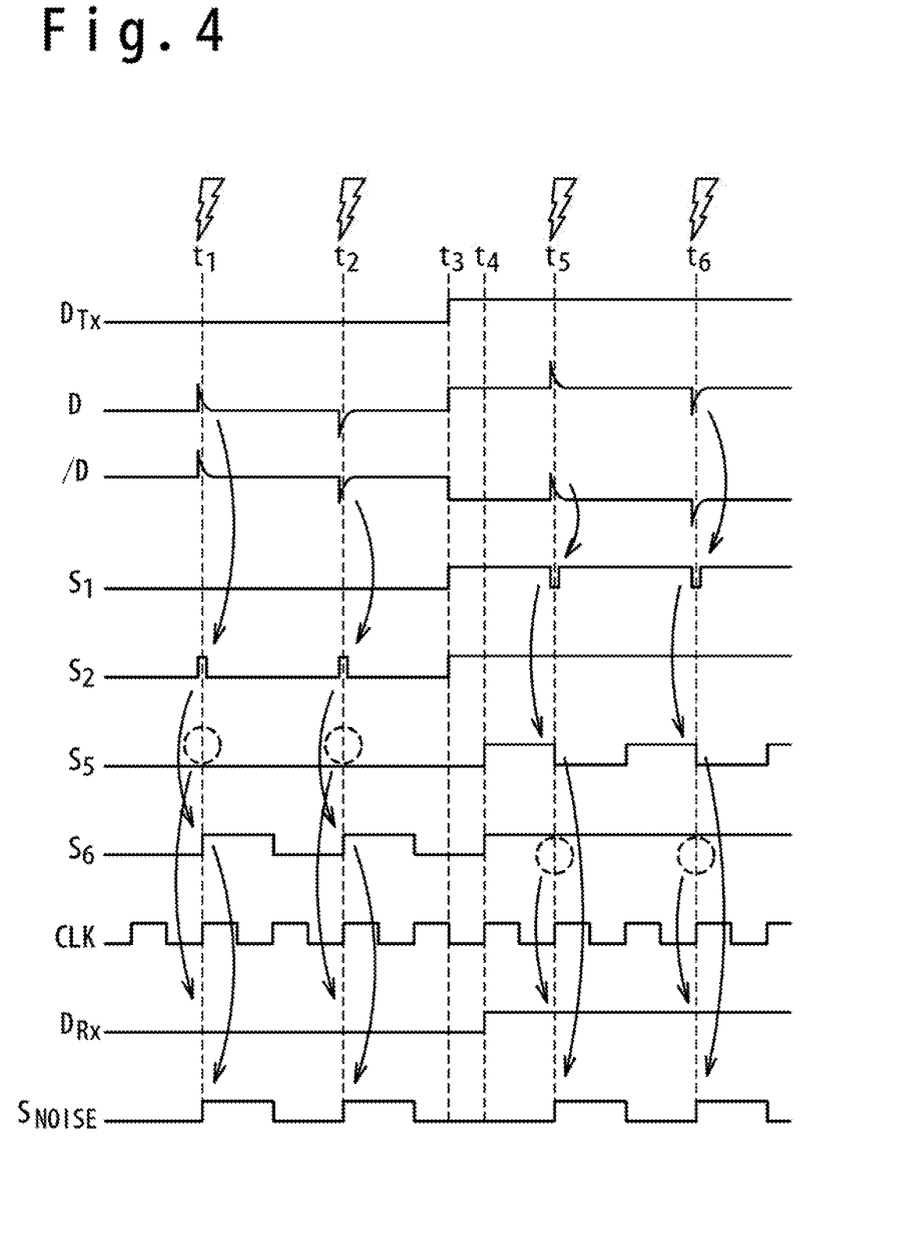
FIG. 4 is a timing chart illustrating an exemplary operation of the digital signal transmission apparatus according to one or more embodiments.

FIG. 4 is a timing chart illustrating an exemplary operation of the digital signal transmission apparatus 10A according to one or more embodiments. The operation of the digital signal transmission apparatus 10A according to one or more embodiments is substantially the same as that of the digital signal transmission apparatus 10 of one or more embodiments, except for that the output signals $S_1$ and $S_2$ of the AND circuitry 21 and the OR circuitry 22 are latched by the flipflops 29 and 30, instead of the output signal $S_3$ of the selector 25 and the output signal $S_4$ of the XOR circuitry 27 being latched by the flipflops 26 and 28.

Common mode noise of the positive polarity is applied at time $t_1$. In this case, the output signal $S_2$ of the OR circuitry 22 temporarily becomes "high" due to an influence of the common mode noise; however, the output signal $S_1$ of the AND circuitry 21 is kept at "low", being free from the influence of the common mode noise. The flipflops 29 and 30 respectively latch the output signals $S_1$ and $S_2$ of the AND circuitry 21 and the OR circuitry 22 in synchronization with a pull-up of the clock signal CLK, to output the output signals $S_5$ and $S_6$, respectively. The selector 31 selects the output signal $S_5$ of the flipflop 29, which corresponds to the output signal $S_1$ of the AND circuitry 21, in response to the logical value on the output node 5, that is, the logical value of the digital reception signal $D_{Rx}$. As a result, the logical value of the output node 5 is kept at "low", being free from the influence of the common mode noise.

Meanwhile, the output signal $S_6$ of the flipflop 30 is set to "high", since the flipflop 30 latches the output signal $S_2$ of the OR circuitry 22 when the logical value of the output signal $S_2$ of the OR circuitry 22 temporarily becomes "high". As a result, the noise detection signal $S_{NOISE}$, which is output from the XOR circuitry 32, is set to "high". By monitoring the noise detection signal $S_{NOISE}$ thus generated, it is possible to detect that common mode noise is applied to the signal lines 3 and 4 at time $t_1$.

Common mode noise of the negative polarity is then applied at time $t_2$. Also in this case, the output signal $S_2$ of the OR circuitry 22 temporarily becomes "high" due to an influence of the common mode noise; however, the output signal $S_1$ of the AND circuitry 21 is kept at "low", being free from the influence of the common mode noise. The flipflops 29 and 30 respectively latch the output signals $S_1$ and $S_2$ of the AND circuitry 21 and the OR circuitry 22 in synchronization with an pull-up of the clock signal CLK, to output the output signals $S_5$ and $S_6$, respectively. The selector 31 selects the output signal $S_5$ of the flipflop 29, which corresponds to the output signal $S_1$ of the AND circuitry 21, in response to the logical value on the output node 5. As a result, the logical value of the output node 5 is kept at "low", being free from the influence of the common mode noise.

Meanwhile, the output signal $S_6$ of the flipflop 30 is set to "high", since the flipflop 30 latches the output signal $S_2$ of the OR circuitry 22 when the logical value of the output signal $S_2$ of the OR circuitry 22 temporarily becomes "high". As a result, the noise detection signal $S_{NOISE}$, which is output from the XOR circuitry 32, is set to "high". By monitoring the noise detection signal $S_{NOISE}$ thus generated, it is possible to detect that common mode noise is applied to the signal lines 3 and 4 at time $t_2$.

The digital transmission signal $D_{Tx}$ is then switched from "low" to "high" at time $t_3$. At this moment, the first and second digital transmission signals D and /D, which are transmitted over the signal lines 3 and 4, respectively, are switched to "high" and "low", respectively. The output signals $S_1$ and $S_2$ are switched from "low" to "high" in the receiver circuitry 2, in response to the first and second digital transmission signals D and /D.

When the clock signal CLK is then pulled up at time $t_4$, the flipflops 29 and 30 respectively latch the logical values of the output signals $S_1$ and $S_2$, and this results in that both of the logical values of the output signals $S_5$ and $S_6$ are set to "high". The digital reception signal $D_{Rx}$ is switched from "low" to "high", since both of the logical values of the output signals $S_5$ and $S_6$ are set to "high".

Common mode noise of the positive polarity is then applied in this state at time $t_5$. In this case, the output signal $S_1$ of the AND circuitry 21 temporarily becomes "low" due to an influence of the common mode noise; however the output signal $S_2$ of the OR circuitry 22 is kept at "high", being free from the influence of the common mode noise. The flipflops 29 and 30 respectively latch the output signals $S_1$ and $S_2$ of the AND circuitry 21 and the OR circuitry 22 in synchronization with a pull-up of the clock signal CLK, to output the output signals $S_5$ and $S_6$, respectively. The selector 31 selects the output signal $S_6$ of the flipflop 30, which corresponds to the output signal $S_2$ of the OR circuitry 22, in response to the logical value on the output node 5, that is, the logical value of the digital reception signal $D_{Rx}$. As a result, the logical value on the output node 5 is kept at "high", being free from the influence of the common mode noise.

Meanwhile, the output signal $S_5$ of the flipflop 29 is set to "low", since the flipflop 29 latches the output signal $S_1$ of the AND circuitry 21 when the logical value of the output signal $S_1$ of the AND circuitry 21 temporarily becomes "low". As a result, the noise detection signal $S_{NOISE}$, which is output from the XOR circuitry 32, is set to "high". By monitoring the noise detection signal $S_{NOISE}$ thus generated, it is possible to detect that common mode noise is applied to the signal lines 3 and 4 at time $t_5$.

Common mode noise of the negative polarity is then applied at time $t_5$. Also in this case, the output signal $S_1$ of the AND circuitry 21 temporarily becomes "low" due to an influence of the common mode noise; however, the output signal $S_2$ of the OR circuitry 22 is kept at "high", being free from the influence of the common mode noise. The flipflops 29 and 30 respectively latch the output signals $S_1$ and $S_2$ of the AND circuitry 21 and the OR circuitry 22 in synchronization with a pull-up of the clock signal CLK, to output the output signals $S_5$ and $S_6$, respectively. The selector 31 selects the output signal $S_6$ of the flipflop 30, which corresponds to the output signal $S_2$ of the OR circuitry 22, in response to the logical value on the output node 5. As a result, the logical value on the output node 5 is kept at "high", being free from the influence of the common mode noise.

Meanwhile, the output signal $S_5$ of the flipflop 29 is set to "low", since the flipflop 29 latches the output signal $S_1$ of the AND circuitry 21 when the logical value of the output signal $S_1$ of the AND circuitry 21 temporarily becomes "low". As a result, the noise detection signal $S_{NOISE}$, which is output from the XOR circuitry 32, is set to "high". By monitoring the noise detection signal $S_{NOISE}$ thus generated, it is possible to detect that common mode noise is applied to the signal lines 3 and 4 at time $t_6$.

The digital signal transmission apparatus 10A according to one or more embodiments can suppress influences of common mode noise in transmitting a digital signal for both of the positive and negative polarities, as is the case with the digital signal transmission apparatus 10 according to one or more embodiments. Additionally, the digital signal transmission apparatus 10A of this embodiment can also detect the application of the common mode noise onto the signal lines 3 and 4.

Figure 5:
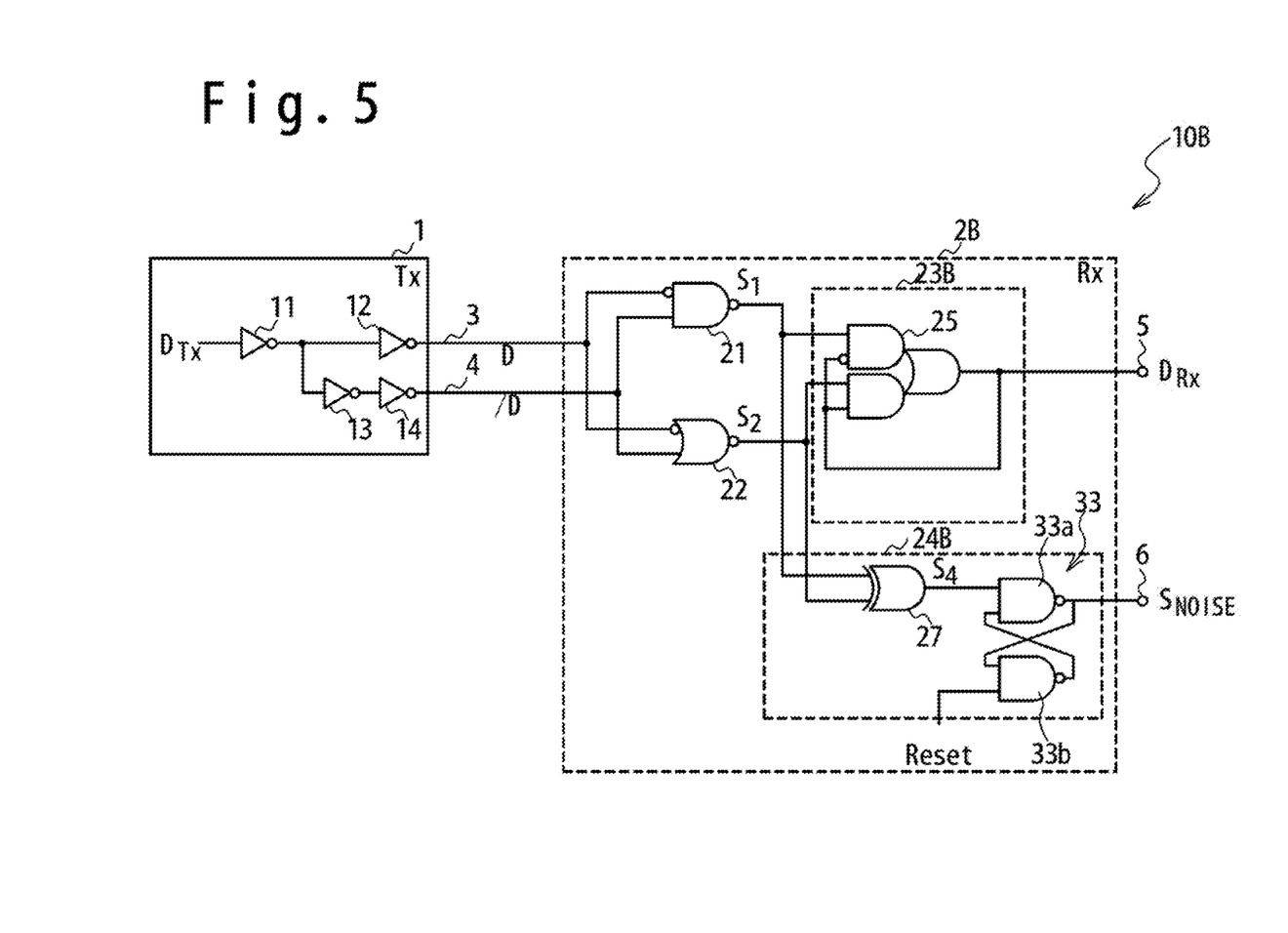
FIG. 5 is a circuit diagram illustrating a configuration of a digital signal transmission apparatus according to one or more embodiments.

FIG. 5 is a circuitry diagram illustrating the configuration of a digital signal transmission apparatus 10B according to one or more embodiments. The digital signal transmission apparatus 10B according to one or more embodiments is configured similarly to the digital signal transmission apparatus 10 according to one or more embodiments and the digital signal transmission apparatus 10A according to one or more embodiments. In another embodiment, the configuration of the receiver circuitry 2B, more specifically, the configurations of the output selector circuitry 23B and the noise detection circuitry 24B are modified. Further, the receiver circuitry 2B is configured to receive a digital signal without using the clock signal CLK.

The output selector circuitry 23B may be configured as a combinational circuit (not a sequential circuit) and may include a selector 25. The selector 25 selects one of the output signals $S_1$ and $S_2$ in response to the logical value on the output node 5, and outputs the selected output signal as the digital reception signal $D_{Rx}$. In this embodiment, the selector 25 selects the output signal $S_1$ of the AND circuitry 21 when the logical value on the output node 5 is "low" and selects the output signal $S_2$ of the OR circuitry 22 when "high".

The noise detection circuitry 24B may include an XOR circuitry 27 and a latch circuitry 33. The XOR circuitry 27 may be configured to output an output signal $S_4$ having the logical value of the exclusive logical sum of the logical value of the output signal $S_1$ of the AND circuitry 21 and the logical value of the output signal $S_2$ of the OR circuitry 22. The latch circuitry 33 may include cross-coupled NAND circuitries 33a and 33b. According to one embodiment, the NAND circuitry 33a has a first input receiving the output signal $S_4$ of the XOR circuitry 27 and a second input connected to the output of the NAND circuitry 33b. The NAND circuitry 33b has a first input connected to the output of the NAND circuitry 33a and a second input receiving a reset signal Reset. The output of the NAND circuitry 33a is connected to the noise detection output 6. The latch circuitry 33 is configured to set the logical value of the output signal thereof to "high" when the logical value of the output signal $S_4$ is set to "high", and keep the output signal thereof at "high" until the reset signal Reset is set to "high". The output signal of the latch circuitry 33 is used as the noise detection signal $S_{NOISE}$. The noise detection circuitry 24B thus configured may be used in place of the noise detection circuitries 24 and 24A in the first and second embodiments.

The digital signal transmission apparatus 10B according to one or more embodiments, is configured to select the output signal $S_1$ of the AND circuitry 21 and the output signal $S_2$ of the OR circuitry 22 in response to the logical value on the output node 5, that is, the logical value of the digital reception signal $D_{Rx}$, can also correctly receive the first and second digital transmission signals regardless of the polarity of common mode noise.

Additionally, the digital signal transmission apparatus 10B according to one or more embodiments can transmit a digital signal without using a clock signal in the receiver circuitry 2B. This feature is advantageous when the digital signal transmission apparatus 10B of this embodiment is used as a clock signal transmission apparatus. The digital signal transmission apparatus 10B of this embodiment can transmit a clock signal by supplying the clock signal as the digital transmission signal $D_{Tx}$ in the transmitter circuitry 1. When a digital signal is received by using a clock signal, the timing of the digital reception signal output from the receiver circuitry depends on the timing of the clock signal. The digital signal transmission apparatus 10B of this embodiment, which does not use the clock signal CLK in the receiver circuitry 2B, may be configured to transmit a clock signal. In this case, the transmitter circuitry 1 outputs a first clock signal to the signal line 3 as the first digital transmission signal D and outputs a second clock signal complementary to the first clock signal to the signal line 4 as the second digital transmission signal /D. The receiver circuitry 2B outputs an output clock signal synchronous with the first and second clock signals as the digital reception signal $D_{Rx}$.

Although various embodiments have been specifically described, it would be understood by a person skilled in the art that the technologies disclosed in the above-described embodiments may be implemented with various modifications.

What is claimed is:

1. A digital signal transmission apparatus, comprising:
   transmitter circuitry configured to output first and second digital transmission signals complementary to each other; and
   receiver circuitry comprising:
      AND circuitry configured to output a first output signal having a logical value based on a product of a logical value of the first digital transmission signal and a logical value complementary to a logical value of the second digital transmission signal;
      OR circuitry configured to output a second output signal having a logical value based on a sum of a logical value complementary to the logical value of the first digital transmission signal and the logical value of the second digital transmission signal; and
      XOR circuitry configured to output a third output signal having a logical value of an exclusive logical sum of the first and second output signals.

2. The digital signal transmission apparatus according to claim 1, wherein the receiver circuitry further comprises output selector circuitry configured to:
   select one of the first and second output signals; and
   output a digital reception signal on an output node of the receiver circuitry in response to the selected one of the first and second output signals.

3. The digital signal transmission apparatus according to claim 2, wherein the output selector circuitry comprises:
   a selector configured to output a selected one of the first and second output signals in response to a logical value on the output node; and
   a flipflop comprising:
   a data input connected to an output of the selector;
   a data output connected to the output node; and
   a clock input receiving a clock signal.

4. The digital signal transmission apparatus according to claim 2, wherein the output selector circuitry comprises:
   a first flipflop comprising:
      a data input receiving the first output signal; and
      a clock input receiving a clock signal;
   a second flipflop comprising:
      a data input receiving the second output signal; and
      a clock input receiving the clock signal; and
   a selector configured to output to the output node a selected one of a fourth output signal received from a data output of the first flipflop and a fifth output signal received from a data output of the second flipflop in response to the logical value on the output node.

5. The digital signal transmission apparatus according to claim 2, wherein the output selector circuitry is configured as a combinational circuit.

6. The digital signal transmission apparatus according to claim 1, wherein the receiver circuitry further comprises latch circuitry configured to latch the third output signal.

7. The digital signal transmission apparatus according to claim 6, wherein the latch circuitry includes cross-coupled NAND gates.

8. The digital signal transmission apparatus according to claim 1, wherein the first digital transmission signal includes a first clock signal, and the second digital transmission signal includes a second clock signal complementary to the first clock signal.

9. A receiver circuitry, comprising:
   AND circuitry configured to:
      receive first and second digital transmission signals complementary to each other; and
      output a first output signal having a logical value of a logical product of a logical value of the first digital transmission signal and a logical value complementary to a logical value of the second digital transmission signal;
   OR circuitry configured to:
      receive the first and second digital transmission signals; and
      output a second output signal having a logical value of a logical sum of a logical value complementary to the logical value of the first digital transmission signal and the logical value of the second digital transmission signal; and
   output selector circuitry configured to:
      select one of the first and second output signals in response to a logical value on an output node; and
      output a digital reception signal to the output node in response to the selected one of the first and second output signals.

10. The receiver circuitry according to claim 9, wherein the output selector circuitry comprises:
    a selector configured to output a selected one of the first and second output signals in response to the logical value on the output node; and
    a flipflop comprising:
    a data input connected to an output of the selector;
    a data output connected to the output node; and
    a clock input receiving a clock signal.

11. The receiver circuitry according to claim 9, wherein the output selector circuitry comprises:
    a first flipflop having a data input receiving the first output signal and a clock input receiving a clock signal;
    a second flipflop having a data input receiving the second output signal and a clock input receiving the clock signal; and
    a selector configured to output to the output node a selected one of a fourth output signal received from a data output of the first flipflop and a fifth output signal received from a data output of the second flipflop in response to the logical value on the output node.

12. The receiver circuitry according to claim 9, wherein the output selector circuitry is configured as a combinational circuit.

13. The receiver circuitry according to claim 9, wherein the first digital transmission signal includes a first clock signal, and the second digital transmission signal includes a second clock signal complementary to the first clock signal.

14. The receiver circuitry according to claim 9, further comprising:
an XOR circuitry configured to output a logical value of an exclusive logical sum of the first and second output signals.

15. A method for digital signal reception, comprising:
receiving first and second digital transmission signals complementary to each other;
outputting a first output signal having a logical value of a logical product of a logical value of the first digital transmission signal and a logical value complementary to a logical value of the second digital transmission signal;
outputting a second output signal having a logical value of a logical sum of a logical value complementary to the logical value of the first digital transmission signal and the logical value of the second digital transmission signal;
selecting one of the first and second output signals in response to a logical value on an output node;
outputting a digital reception signal to the output node in response to the selected one of the first and second output signals; and
outputting a logical value of an exclusive logical sum of the first and second output signals.

16. The method according to claim 15, further comprising:
detecting noise based on the logical value of the exclusive logical sum of the first and second output signals.

\* \* \* \* \*